United States Patent
Biber et al.

(10) Patent No.: US 10,061,002 B2
(45) Date of Patent: Aug. 28, 2018

(54) METHOD FOR CONTROLLING A MAGNETIC RESONANCE APPARATUS AND CONTROLLER FOR A MAGNETIC RESONANCE APPARATUS

(71) Applicant: Siemens Aktiengesellschaft, Munich (DE)

(72) Inventors: Stephan Biber, Erlangen (DE); Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 201 days.

(21) Appl. No.: 15/040,205

(22) Filed: Feb. 10, 2016

(65) Prior Publication Data
US 2016/0231407 A1   Aug. 11, 2016

(30) Foreign Application Priority Data

Feb. 10, 2015   (DE) .................. 10 2015 202 359

(51) Int. Cl.
*G01R 33/54* (2006.01)
*G01R 33/28* (2006.01)

(52) U.S. Cl.
CPC .......... *G01R 33/543* (2013.01); *G01R 33/28* (2013.01)

(58) Field of Classification Search
CPC ............................. G01R 33/543; G01R 33/28
USPC .......................................................... 700/90
See application file for complete search history.

(56) References Cited

U.S. PATENT DOCUMENTS

| | | | | |
|---|---|---|---|---|
| 2007/0101242 A1* | 5/2007 | Yancey | ............... | G06F 13/4256 714/776 |
| 2008/0136417 A1* | 6/2008 | Baumgartl | ............. | G01R 33/36 324/322 |
| 2009/0251141 A1* | 10/2009 | Baumgartl | ............. | G01R 33/36 324/307 |
| 2011/0040997 A1* | 2/2011 | Baumgartl | ........... | G01R 33/543 713/401 |
| 2014/0023048 A1* | 1/2014 | Vu | ........................... | H04B 7/26 370/336 |

(Continued)

OTHER PUBLICATIONS

Diniz, "Überlegungen zu breitbandigen Wandler-Applikationen JESD204B—oder serielle LVDS-Schnittstelle?" in: all-electronics. de (Reflections on wideband converter applications JESD204B or serial LVDS interface?) in all-electronics (2015).

*Primary Examiner* — Ly D Pham
(74) *Attorney, Agent, or Firm* — Schiff Hardin LLP

(57) ABSTRACT

In a method and controller for controlling a magnetic resonance system, a sequence of synchronized control commands is transmitted to different system components of the magnetic resonance system. For different system components a number of control commands is supplied in a relative chronological order in relation to a defined system time, wherein the control commands in the relative chronological order are each allocated times that specify when a particular control command should be executed in relation to a defined system time. The control commands are passed in the relative chronological order to a data-converting interface, which forwards the control commands in a latency-compensating data transfer protocol via a bus system, which has a deterministic latency, to the individual system components.

5 Claims, 3 Drawing Sheets

(56) References Cited

U.S. PATENT DOCUMENTS

| | | | | |
|---|---|---|---|---|
| 2015/0077109 A1* | 3/2015 | Grodzki | ............ | G01R 33/3854 |
| | | | | 324/309 |
| 2015/0108981 A1* | 4/2015 | Grodzki | ............ | G01R 33/3671 |
| | | | | 324/318 |
| 2015/0204959 A1* | 7/2015 | Grodzki | ............... | G01R 33/543 |
| | | | | 324/314 |
| 2015/0365837 A1* | 12/2015 | Valasma | ............... | H04W 24/08 |
| | | | | 455/418 |
| 2016/0204809 A1* | 7/2016 | Pratt | ........................ | H04B 1/04 |
| | | | | 375/219 |

* cited by examiner

METHOD FOR CONTROLLING A MAGNETIC RESONANCE APPARATUS AND CONTROLLER FOR A MAGNETIC RESONANCE APPARATUS

BACKGROUND OF THE INVENTION

Field of the Invention

The invention concerns a method for controlling a magnetic resonance apparatus, wherein a sequence of synchronized, i.e. coordinated, control commands is transmitted to different system components of the magnetic resonance apparatus. The invention also concerns a controller for carrying out a method of this type, and to a magnetic resonance apparatus having a controller of this type.

Description of the Prior Art

In a magnetic resonance apparatus, also called a magnetic resonance tomography system, the body to be examined is conventionally exposed, with the use of a basic field magnet, to a relatively high basic magnetic field, for example of 1.5 tesla, 3 tesla or 7 tesla, in order to create magnetic resonance scans. In addition, a magnetic field gradient is applied with the use of a gradient system. Radio-frequency excitation signals (RF signals) are then emitted by a radio-frequency transmitting system by suitable antenna devices, and this is intended to tilt the nuclear spins of specific atoms resonantly excited by this radio-frequency field, by a defined flip angle with respect to the magnetic field lines of the basic magnetic field. When the nuclear spins are relaxed, radio-frequency signals, known as magnetic resonance signals, are emitted, which are received by a radio-frequency receiving system by suitable receiving antennae, and then processed further. Finally, the desired image data can be reconstructed from the raw data acquired in this way.

For a specific scan, a specific a pulse sequence should be emitted, and this includes a sequence of radio-frequency pulses, in particular excitation pulses and refocusing pulses, and appropriate gradient pulses that are to be emitted in a coordinated manner in various directions. Readout windows for the radio-frequency receiving system are set at a time appropriate therewith, during which the induced magnetic resonance signals are detected. Particularly crucial to the imaging is the timing within the sequence, i.e. the intervals at which pulses follow each other.

Particularly exact coordination or synchronization of the application of gradient fields, radio-frequency transmitting fields and receive events, i.e. activation of the respective receiving devices of the radio-frequency receiving system, is necessary. The requirements of the coordination accuracy are in the range of 1 ns to 100 µs.

For this purpose, the individual system components of the magnetic resonance system, such as the gradient system, radio-frequency transmitting system and radio-frequency receiving system, must be addressed equally exactly. Each of these system components (which can also be regarded as subsystems of the magnetic resonance system) obviously has further subcomponents, such as the gradient amplifiers (conventionally called GPAs=Gradient Power Amplifiers) of the gradient system and the radio-frequency transmission amplifiers (conventionally called RFPAs=Radio Frequency Power Amplifiers) of the radio-frequency transmission system or generally different DACs (Digital Analog Converters) and/or ADCs (Analog Digital Converters). To control the amplifiers, for example the digital signals generated by the controller of the magnetic resonance system are converted into analog signals by DACs and processed further. Conversely, when the magnetic resonance signals, which arrive back at the receiving antennae from the excited spins, are received it is necessary to convert the analog signals into digital signals by the use of ADCs. The individual amplifiers, DACs and ADCs or further subcomponents of the various components or subsystems of the magnetic resonance system are often situated at physically separate locations, for example on different boards or even in different switching cabinets or rooms in the practice or hospital. It is also possible, particularly in the case of a high number of received signals, for a number of components to exist for each component or device type (such as, for example, gradient DACs, radio-frequency transmission DACs, radio-frequency receive ADCs), which can likewise again be spatially distributed.

In addition, there is also a large number of further optional components or subsystems, such as shim systems, camera systems, monitoring systems, table-positioning sensors and table-positioning systems, patient monitoring devices, etc., which must also receive their commands in synchronization with the system components mentioned above, and can similarly have further subcomponents.

Synchronization of the system components or subsystems mentioned above and the associated device types within the required accuracy range makes high demands on the controller, and therefore has conventionally required the development of proprietary solutions adapted specifically to the respective magnetic resonance system. There are various annular or star-shaped architectures for the distribution of a clock (clock signal) for the standardized system time (i.e. a standardized absolute interval within the magnetic resonance system) as a synchronization signal. In each case, however, proprietary, specifically adapted protocols and systems are developed for each individual magnetic resonance system, and these distribute the clock and the absolute time information to the distributed system components in such a way that the desired synchronization is attained. These proprietary solutions for each newly developed type of magnetic resonance system lead to high development costs and to additional risks with respect to possible development errors.

SUMMARY OF THE INVENTION

An object of the present invention is to provide a simpler and less expensive alternative to these control methods and devices with proprietary synchronization methods.

In the control method, according to the invention multiple control commands are supplied in a relative chronological order in relation to a defined system time for the different system components (including their individual subcomponents or devices). The control commands in the relative chronological order are each allocated times, which specify when a particular control command should be executed in relation to a defined system time. The system time is defined here by a system clock, as described above, that is valid for all system components, so the relative times between the events, which are to be initiated by the control commands for the different system components, such as switching a gradient coil, emitting a radio-frequency pulse, etc., occur at an appropriate interval from each other. In other words, the system time ensures that the intervals are precisely defined.

The number of control commands of an (individual) specific system component can be a plurality of such control commands that are to be processed in a specific sequence, but in an extreme case can also be just one individual control command (e.g. just a single control command for switching a DAC to read the received magnetic resonance signals, wherein this one control command must, however, be appropriate time-wise in relation to the control commands of the other system components). A control command can, in turn, include a number of sub-control commands for different subcomponents of the respective system components. For example, the control commands can be created in the form of event blocks, wherein it is determined which system components (or subcomponents of the individual system components) should do what when in order to achieve a specific event. For example, a command could cause the emission of a specifically formed radio-frequency pulse by the radio-frequency transmitting system and further precisely defined gradient pulses by the different gradient coils in the x, y and z directions (in different directions) of the gradient system.

According to the invention, this sequence of control commands for the different system components is passed in the correct relative chronological order firstly to a data-converting interface which forwards the control commands in a latency-compensating data transfer protocol by a bus system, which has a deterministic latency, to the individual system components such that the events imitated by the control commands each occur at the required instant (relative to all other events). The activities that are to be carried out are therefore passed in exact chronology with respect to the absolute system time to the latency-compensating bus system or communications network and in the case of the system components are then executed "immediately". The events are executed with a certain temporal offset which, however, is constant and the same for all system components. The temporal relationships are therefore retained exactly.

For this purpose, a corresponding controller has a command supply unit which is designed to supply a number of control commands, in a relative chronological order in relation to a defined system time, for different system components of the magnetic resonance system, wherein the control commands in the relative chronological order are each allocated times which specify when a particular control command should be executed in relation to a defined system time. In addition, the controller also has a data-converting interface, which is designed to accept the control commands in the relative chronological order and in a latency-compensating data transfer protocol to forward them by way of a bus system, which has a deterministic latency, to the individual system components.

Unlike the conventional approach, processing of the time-critical transfer of the commands, or latency management in the transfer of the data does not occur at the same time as creation of the control sequences. Instead, the commands are supplied in the correct relative chronological order and passed to a latency-compensating communications network (without extra time stamps which would then have to be processed by the data-converting interface or the communications network) logically separated from each other in two different stages. The crux of the idea therefore lies in supplying and performing instructions that are already synchronized with the system time, i.e. in the transmission and/or receive commands and/or commands for switching the gradient coils, via a defined interface to an independent instance that already deals with all of the latency problems during transfer of the commands to the individual system components as a finished solution. Possible jitter or other characteristics that influence the time can preferably also already be taken into account within the data-converting interface or the bus system.

The command supply unit and the data-converting interface are accordingly at least logically separate units which can be implemented in separate, but optionally also in shared, assemblies, for example on a shared PCB (printed circuit board) or in a shared FPGA. What is decisive, however, is that they are logically separate to the extent that with a development of other types of magnetic resonance system, the same data-converting interface having the same data transfer protocol can again be used and a new development is not required in each case. This reduces the costs of system development on the one hand and the susceptibility to errors on the other.

Apart from a conventional basic magnetic field system for applying the basic magnetic field, the scanner of a corresponding magnetic resonance system has a gradient system, conventionally having three gradient coils for the three directions, and a conventional radio-frequency transmitting system and a radio-frequency receiving system, and a controller as has been explained above.

The number of control commands for the different system components is expediently passed to the data-converting interface with a lead time (i.e. a defined time before the respective control commands have to be forwarded), which is longer than a maximum latency of the data transfer to the system components (optionally including the internal latency of the system components, i.e. the time to the start of the command execution of the system components). In other words, the latencies relating to the different system components or their subcomponents are calculated or ascertained in some other way in advance within the bus system, which according to the invention has a deterministic latency, and the maximum ascertained latency specifies with which lead time at least the control commands have to be passed to the data-converting interface, so latency management (by the data-converting interface or the bus system) can occur accordingly such that all control commands within the sequence are carried out at the correct time relative to the other control commands within the specified accuracy.

A high-speed bus system, preferably a serial multi-gigabit bus system, is used as the bus system.

It is especially advantageous if a standard protocol is used as the latency-compensating data transfer protocol. A standard protocol should be taken to mean a protocol for which commercial components are available (what are known as "Commercial off the shelf components"="COTS components"). If such freely commercially available latency-compensating data transfer protocols and devices that are required for these are used, the inventive solution exhibits its particular strength since then the complete development can be achieved particularly inexpensively and with low error rates.

A JESD204B protocol is used as the particularly preferred standardized latency-compensating data transfer protocol. A JESD204B data converter is accordingly also used as the data-converting interface. Data converters of this kind are already being used for other purposes, for example for controlling production plant.

Other high speed protocols apart from a JESD204B protocol could also be considered, however, which work to compensate latency, such as, for example, the "White-Rabbit" method, as is used by CERN.

DESCRIPTION OF THE PREFERRED EMBODIMENTS

Figure 1:
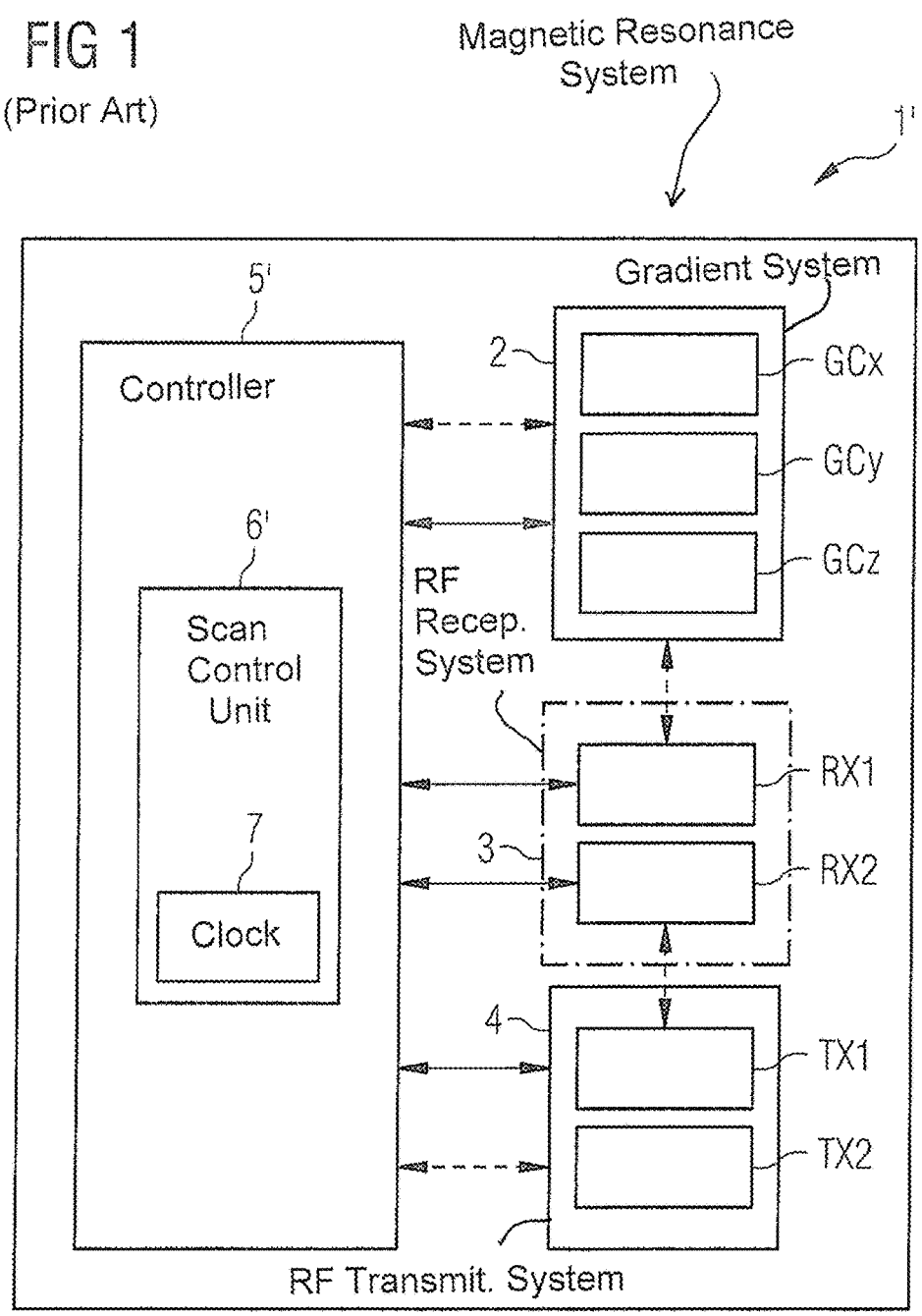
FIG. 1 is a block diagram of central system components of a magnetic resonance system according to the prior art.

FIG. 1 is a simplified block diagram of the most important system components or subsystems of a magnetic resonance system, which have to be controlled in a dynamically time-critical manner during the course of a magnetic resonance scan.

These include firstly a gradient system 2 having three magnetic field gradient coils GCx, GCy, GCz for generating magnetic field gradients in the x, y and z directions. These magnetic field gradient coils GCx, GCy, GCz for the different directions can be controlled independently of each other, so gradients can be applied by a specified combination in any logical directions, for example in the slice selection direction, in the phase coding direction or in the read direction. These directions are usually dependent on the selected slice orientation. The logical directions can likewise also match the x, y and z directions, however, for example slice selection direction in the z direction, phase coding direction in the y direction and read direction in the x direction.

A radio-frequency transmitting system 4 and a radio-frequency receiving system 3 also form part of these time-critical system components of the magnetic resonance system 1, or ones that re to be controlled in coordination with corresponding pulse sequences. The radio-frequency transmitting system 4 usually in turn includes a number of subsystems or subcomponents, for example a number of transmitting coils (or transmitting antennae), here two transmitting coils, TX1, TX2 with associated transmission amplifiers, etc. The radio-frequency receiving system 3 can accordingly also have almost any number of sub-receiving systems each with individual receiving coils (or receiving antennae), pre-amplifiers, analog-to-digital converters, etc. Two receiving coils RX1, RX2 are shown here in a simplified manner as subsystems or subcomponents.

The transmitting coils TX1, TX2, to transmit the radio-frequency signals, can be for example a conventional body coil or optionally additional local coils. These transmitting coils can likewise be used as receiving coils if they can be switched between receive and transmit modes. Basically it is also possible to use separate receiving coils, however.

In the sense of being supplied with correctly coordinated control commands, the subsystems or subcomponents GCx, GCy, GCz, TX1, TX2, RX1, RX2 of the higher-order system components 2, 3, 4, 10 can again also each be regarded as system components GCx, GCy, GCz, TX1, TX2, RX1, RX2 themselves, moreover.

Apart from the system components 2, 3, 4, GCx, GCy, GCz, TX1, TX2, RX1, RX2 shown in FIG. 1 a magnetic resonance system 1' of this kind of course also has a large number of further system components or subsystems, in particular a main field magnetic system, to subject the examination object or the patient (not shown) first of all to a basic magnetic field. A substantial portion of the system components is arranged in a scanner (not shown either) in which a patient tunnel (bore) is centrally arranged where the examination object can be positioned on a movable table so it can be moved in and out, or at any location in the bore. The basic magnetic field system is constructed such that an optimally homogeneous basic magnetic field is applied in a defined central region inside this bore. The gradient coils are accordingly wound such that, as described above, a magnetic field gradient can be superimposed in different directions on the basic magnetic field inside the bore, and the transmitting and receiving coils are accordingly arranged such that inside this bore they emit the radio-frequency signals in specific regions or receive from them. All of these system components are known to those skilled in the art, however, and thus do not need to be illustrated further in detail herein. Reference is also made at this point to the fact that, for example, U-shaped magnetic resonance systems that are open at the side, or magnetic resonance systems of a smaller type for individual limbs, etc. can also be inventively controlled in addition to a magnetic resonance system having a bore mentioned above.

As illustrated here, the individual components of the magnetic resonance system are controlled by a controller 5'. For emitting a control sequence, i.e. a sequence of control commands, to the individual system components 2, 3, 4, including their subcomponents GCx, GCy, GCz, RX1, RX2, TX1, TX2, this contains a scan control unit 6' in each case which generates the required control commands, as will be explained below with reference to FIG. 3, and transmits them at the right time to the individual system components, so these execute the commands at the appropriate time relative to each other, and therefore the desired physical events occur. The controller 5' can, moreover, also have a large number of further components, for example components for processing the signals received by the radio-frequency receiving system further, or raw data and optionally reconstruction units in order to reconstruct the image data from the raw data, etc.

This scan control unit 6' can be implemented, for example, on an FPGA of the controller 5', wherein this FPGA usually also contains a clock 7 (an "absolute clock") which specifies the system time, i.e. a clock standardized for the entire magnetic resonance system, according to which all individual system components 2, 3, 4, along with subcomponents GCx, GCy, GCz, TX1, TX2, RX1, RX2, must conform to achieve the desired synchronization.

As described in the introduction, synchronization is extremely difficult due to the required accuracy of 1 ns to 100 µs. There are different architectures for distribution of the system times as a synchronization signal together with the control commands. The solid arrows in FIG. 1 show a star-shaped architecture in which the control commands are each transmitted individually at the right time according to the system times by the controller 5'. By way of the broken-line arrows FIG. 1 shows an alternative annular structure, in which the commands and the clock signal are transmitted further annularly, so all system components can receive and execute their commands at the correct time.

Overall latency management is implemented in a proprietary transfer protocol in the FPGA, i.e. in the scan control unit 6', and this means that previously for every new development of a magnetic resonance system, the protocol had to be specifically developed for this as well, a fact that makes the entire development more expensive and more susceptible to errors.

In order to provide a remedy for this, according to the invention the controller 5 of the magnetic resonance system 1 is accordingly constructed in a different way architectonically, with a specific command supply unit 8 and a data-converting interface 9 logically separate therefrom which independently takes care of overall latency management during the transmission of control commands. This is illustrated using the example in FIG. 2.

In principle the controller 5 can be constructed largely like the controller 5' according to FIG. 1, in particular also with all further conventional components. In contrast to the controller 5' according to the prior art, the FPGA, for example, forming the scan control unit 6, can have at least two separate logic units, however. One of the logic units is the command supply unit 8 (which could also be called the "Synchronized Instruction Supply"). This likewise makes use of the system time or a clock 7 (absolute clock) and supplies a number of control commands in a relative chronological order in relation to a defined system time t for the individual system components 2, 3, 4, 10, GCx, GCy, GCz, TX1, TX2, RX1, RX2 (which can be designed in the same way as in the case of the exemplary embodiment in FIG. 1), wherein the control commands in the relative chronological order are each allocated times which specify when a particular control command should be executed in relation to the defined system time.

Figure 3:
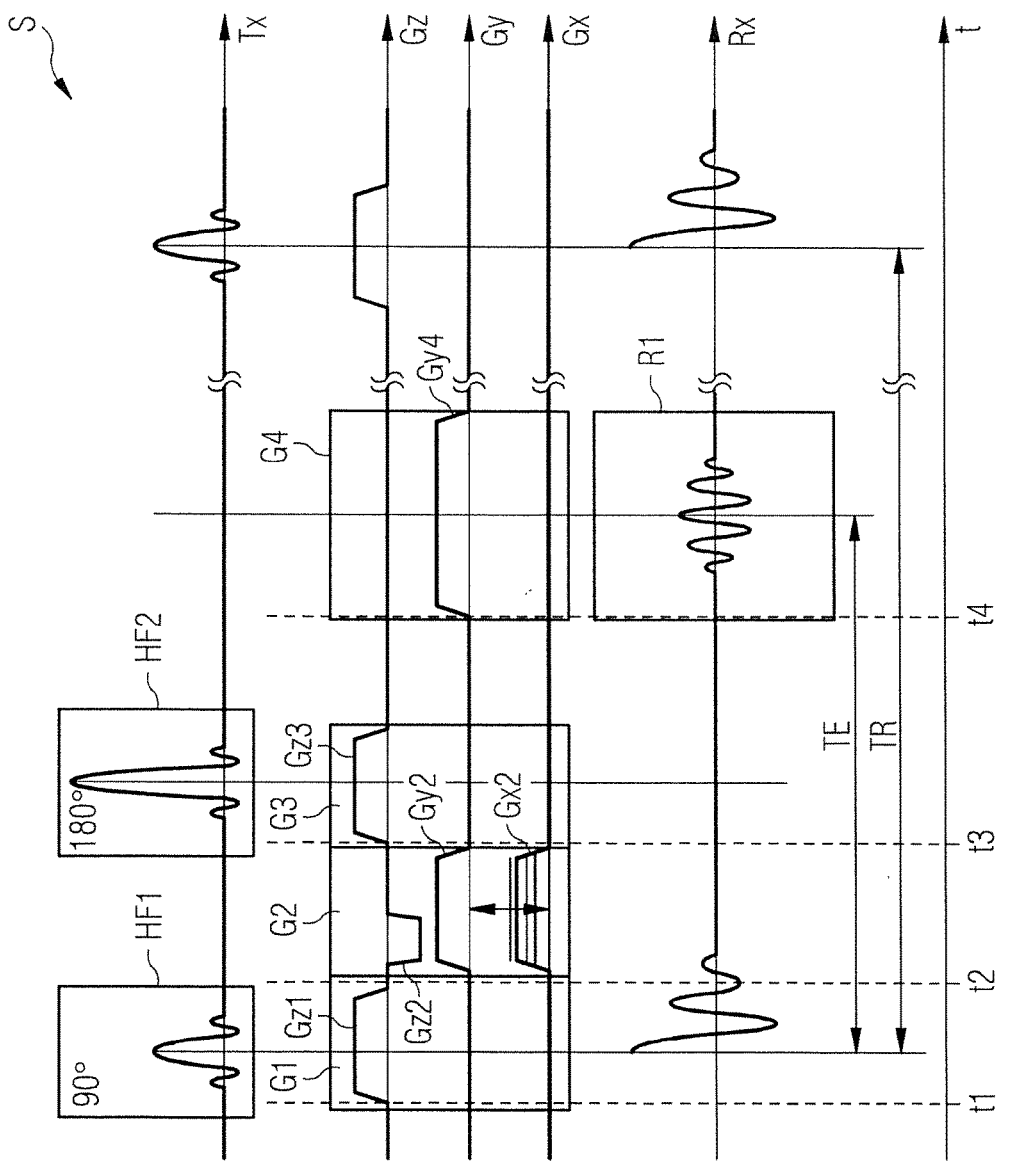
FIG. 3 shows an exemplary pulse sequence to which the inventive method can be applied, divided into event blocks.

FIG. 3 shows an example of this. A conventional pulse graph using the example of a spin echo sequence S is shown there. In this pulse graph are shown, one above the other on different time axes, the different pulses which have to be executed by the different system components 2, 3, 4, 10, GCx, GCy, GCz, TX1, TX2, RX1, RX2.

The radio-frequency signal to be emitted is shown on the top axis (transmitting axis Tx). In this spin echo sequence S two radio-frequency pulses HF1, HF2 have to be emitted one after the other: firstly a 90° excitation pulse and then at a certain interval a 180° refocusing pulse HF2. Since both radio-frequency pulses HF1, HF2 should act selectively spatially, a slice selection gradient pulse Gz1, Gz3 should be switched at the same time in each case, and this is shown on the second axis from the top, the slice selection axis Gz. A further slice selection gradient pulse Gz2 in the negative direction and a frequency coding gradient pulse Gy2 on the frequency coding axis Gy (third axis from the top) and a phase coding gradient pulse Gx2 in the phase coding direction, i.e. on the phase coding axis Gx, are emitted between these two slice selection gradient pulses Gz1, Gz3 in the slice selection direction.

The individual gradient pulses Gz1, Gz2, Gz3, Gy2, Gx2 for the different directions are combined here as gradient events G1, G2, G3 respectively.

Following a specific echo time TE after the maximum of the first radio-frequency pulse HF1 an echo signal then occurs which has to be detected in order to acquire the raw data for the image reconstruction. For this purpose a read window R1 is simultaneously switched as an event at the ADC of the receiver (see read axis Rx). At the same time a read gradient pulse Gy4 occurs, and this is shown as gradient event G4. Following a repetition time TR the sequence S is then repeated, wherein the phase coding gradient pulse Gx2 is then set at a different amplitude in each case until a desired slice is read.

As shown here, the individual events, which are initiated by the control commands or constitute the control commands in this regard, i.e. the occurrence of the radio-frequency pulses HF1, HF2 and gradient events G1, G2, G3, G4 and the setting of the read window R1, begin at precisely defined times or instants t1, t2, t3, t4 in respect of the system time t (see bottom axis of the sequence graph in FIG. 3).

Figure 2:
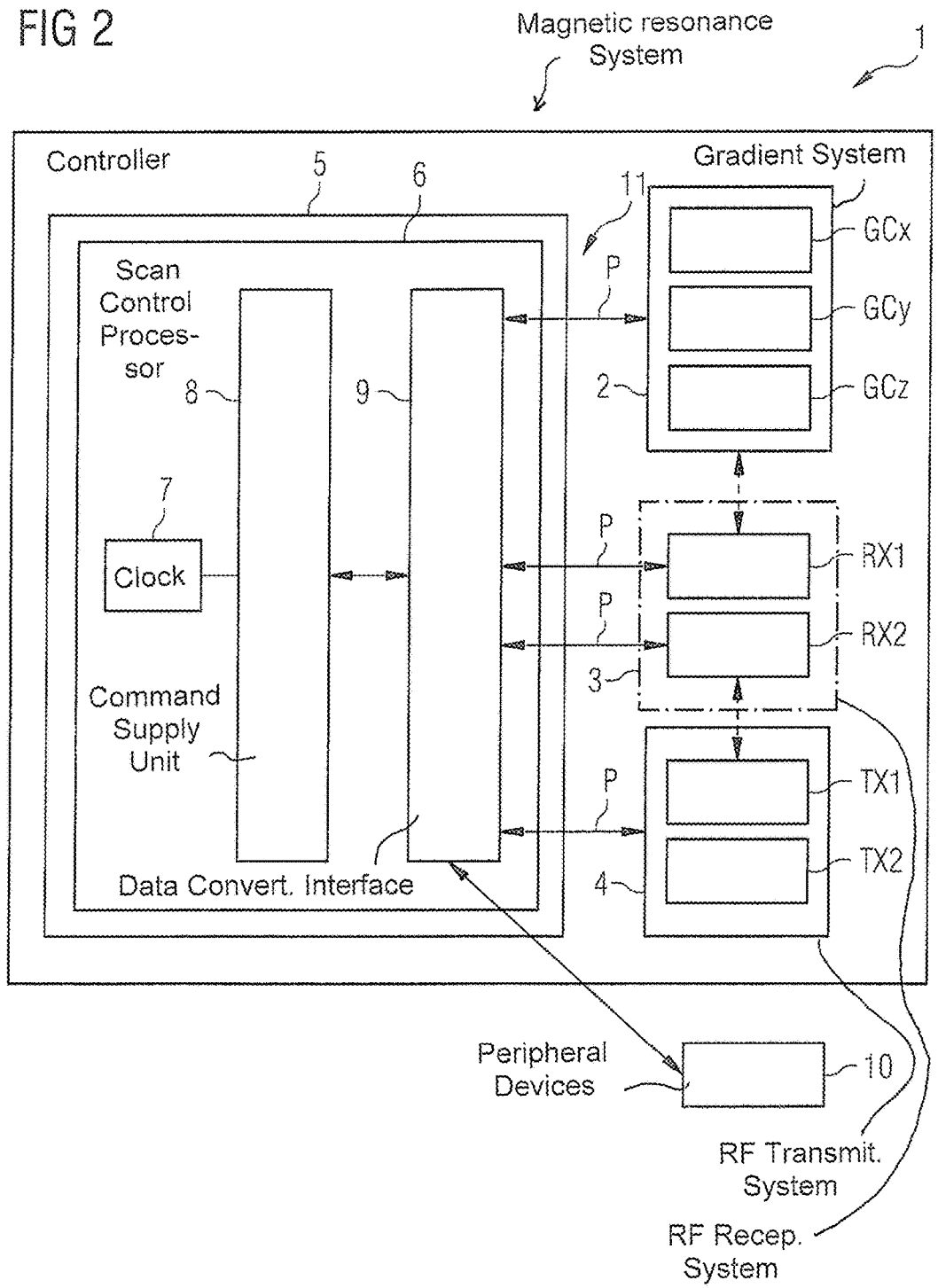
FIG. 2 is a block diagram of central system components of an exemplary embodiment of an inventive magnetic resonance system.

In the exemplary embodiment according to FIG. 2 the command supply unit 8 therefore passes the control commands, which contain the exact data about the pulses to be switched, i.e. their form, duration, etc., in the exact relative chronological order in relation to the system time t, i.e. at the exact relative times t1, t2, t3, t4, to the data-converting interface 9.

In the illustrated exemplary embodiment this is a JESD204B converter. This implements the incoming control commands in a latency-compensating data transfer protocol P, here the JESD204B protocol (i.e. in a protocol to the JESD204B standard), with the relative times t1, t2, t3, t4 being considered. All control commands are then transmitted by a corresponding JESD204B bus system 11, whose latencies in relation to the individual system components 2, 3, 4 or their subcomponents GCx, GCy, GCz, TX1, TX2, RX1, RX2 are precisely known, and the individual system components 2, 3, 4 or their subcomponents GCx, GCy, GCz, TX1, TX2, RX1, RX2 become active at the correct time. Apart from the latencies this JESD204B protocol is also capable of independently compensating jitters or other problems relevant to time. In other words, during forwarding of the commands the relative times t1, t2, t3, t4 are changed in the JESD204B bus system 11 such that the relative delays occurring thereafter, caused by different latencies pertaining to the different system components 2, 3, 4 or their subcomponents GCx, GCy, GCz, TX1, TX2, RX1, RX2, jitters, etc. are compensated and the control commands are ultimately executed at the system components 2, 3, 4 or their subcomponents GCx, GCy, GCz, TX1, TX2, RX1, RX2 at the correct relative times t1, t2, t3, t4 again.

As shown in FIG. 2, it is possible to also connect optional further peripheral devices 10 to this data-converting interface 9, such as, for example, shim devices, detuning circuits, coil switching units, field cameras, system monitoring units, table position sensors and controllers, interventional devices, patient monitoring equipment, such as ECG, respiratory sensors, etc., if they are to be used at the same time.

Use of JESD204B is particularly advantageous since this is an industry standard, so, in contrast to proprietary solutions, the components are particularly inexpensive and, furthermore, it is also possible to participate in developments in this technology. It is also possible to synchronize different devices, such as different ADCs, DACs, with different techniques and accuracies (e.g. different subclasses, in particular subclasses 1 or 2, of the JESD204B standard).

The above-described detailed method and structures are exemplary embodiments, and the basic principle can be varied within wide ranges by those skilled in the art without departing from the scope of the invention. It is therefore possible to use any number of devices (subcomponents) for the individual system components, i.e. also simultaneously any number of transmitter units and/or receiver units, which can also be widely spaced apart from each other. The inventive method may also be used in annular architectures. Reference is also made in particular to the fact that the inventive method may be used with any pulse sequences.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling a magnetic resonance system comprising:
    in a data supply processor of a magnetic resonance system, formulating a plurality of individual control commands for respectively operating a plurality of different system components of a magnetic resonance system, and organizing said plurality of control commands in a relative chronological order with respect to a defined system clock, and allocating, to each respective control command in said relative chronological order, an allocated time that specifies when the respective control command should be executed relative to the other control commands in said relative chronological order;

transferring said control commands in said relative chronological order from said data supply processor to a data-converting interface and, from said data-converting interface forwarding the control commands to the different system components via a bus system that exhibits a known latency, including a known maximum latency; and in said data-converting interface, generating a latency-compensating data transfer protocol that includes said control commands with said respective allocated times adjusted dependent on said known latency of said bus system, and transmitting said control commands to said different system components according to said latency-compensating data transfer protocol with a lead time that is longer than said known maximum latency.

2. A method as claimed in claim 1 comprising using a serial multi-gigabit bus system as said bus system.

3. A method as claimed in claim 1 comprising using a JESD204B protocol as said latency-compensating data transfer protocol.

4. A controller for a magnetic resonance system comprising:
- a data supply processor configured to formulate a plurality of individual control commands for respectively operating a plurality of different system components of a magnetic resonance system, and organizing said plurality of control commands in a relative chronological order with respect to a defined system clock, and allocating, to each respective control command in said relative chronological order, an allocated time that specifies when the respective control command should be executed relative to the other control commands in said relative chronological order;
- a data-converting interface in communication with said data supply processor, said data supply processor being configured to transfer said control commands in said relative chronological order from said data supply processor to said data-converting interface;
- said data-converting interface being configured to forward the control commands to the different system components via a bus system that exhibits a known latency, including a known maximum latency; and
- said data-converting interface being configured to generate a latency-compensating data transfer protocol that includes said control commands with said respective allocated times adjusted dependent on said known latency of said bus system, and to transmit said control commands to said different system components according to said latency-compensating data transfer protocol with a lead time that is longer than said known maximum latency.

5. A magnetic resonance apparatus comprising:
- a magnetic resonance data acquisition scanner comprising a basic field magnet, a gradient coil arrangement, a radio-frequency transmitter and a radio-frequency receiver, collectively representing a plurality of different system components;
- a data supply processor configured to formulate a plurality of individual control commands for respectively operating a plurality of different system components of a magnetic resonance system, and organizing said plurality of control commands in a relative chronological order with respect to a defined system clock, and allocating, to each respective control command in said relative chronological order, an allocated time that specifies when the respective control command should be executed relative to the other control commands in said relative chronological order;
- a data-converting interface in communication with said data supply processor;
- said data supply processor being configured to transfer said control commands in said relative chronological order from said data supply processor to said data-converting interface;
- said data-converting interface being configured to forward the control commands to the different system components via a bus system that exhibits a known latency, including a known maximum latency; and
- said data-converting interface being configured to generate a latency-compensating data transfer protocol that includes said control commands with said respective allocated times adjusted dependent on said known latency of said bus system, and to transmit said control commands to said different system components according to said latency-compensating data transfer protocol with a lead time that is longer than said known maximum latency.

* * * * *